(12) United States Patent
Jeon et al.

(10) Patent No.: US 11,087,646 B2
(45) Date of Patent: Aug. 10, 2021

(54) ELECTRODE OR WIRING COMPRISING AMORPHOUS METAL LAYER, FLEXIBLE DISPLAY DEVICE COMPRISING THE SAME AND MANUFACTURING METHOD THEREOF

(71) Applicant: Korea University Research and Business Foundation, Sejong Campus, Sejong-si (KR)

(72) Inventors: Sang Hun Jeon, Seoul (KR); Kung Won Rhie, Seoul (KR); Min Hyun Jung, Sejong-si (KR); Chang Jin Yun, Seoul (KR)

(73) Assignee: KOREA UNIVERSITY RESEARCH AND BUSINESS FOUNDATION, SEJONG CAMPUS, Sejong-si (KR)

( * ) Notice: Subject to any disclaimer, the term of this patent is extended or adjusted under 35 U.S.C. 154(b) by 0 days.

(21) Appl. No.: 16/136,766

(22) Filed: Sep. 20, 2018

(65) Prior Publication Data

US 2019/0088167 A1    Mar. 21, 2019

(30) Foreign Application Priority Data

Sep. 21, 2017  (KR) ........................ 10-2017-0121747

(51) Int. Cl.
*H01L 51/52* (2006.01)
*G09F 9/30* (2006.01)
(Continued)

(52) U.S. Cl.
CPC ........... *G09F 9/301* (2013.01); *G09G 3/3233* (2013.01); *H01L 27/1218* (2013.01); *H01L 27/1244* (2013.01); *H01L 27/3276* (2013.01); *G09G 3/3208* (2013.01); *G09G 2300/0852* (2013.01); *G09G 2310/0262* (2013.01); *G09G 2320/0295* (2013.01); *G09G 2320/0693* (2013.01);
(Continued)

(58) Field of Classification Search
CPC ............ H01L 51/5215; H01L 51/5234; H01L 27/3276; H01L 51/5203
See application file for complete search history.

(56) References Cited

U.S. PATENT DOCUMENTS

2013/0212856 A1*  8/2013  Winkler ..................... B21J 5/00
                                                              29/428
2014/0302310 A1* 10/2014  Cowell, III ........... H01L 29/154
                                                              428/336
(Continued)

FOREIGN PATENT DOCUMENTS

JP    2010152004 A    7/2010
JP    2012133374 A    7/2012
(Continued)

OTHER PUBLICATIONS

Muir, WO 2017/066332 A1, published Apr. 20, 2017.*

*Primary Examiner* — Suberr L Chi
(74) *Attorney, Agent, or Firm* — McCoy Russell LLP (57) ABSTRACT

Provided are a flexible display device including an electrode or wiring including an amorphous metal layer using amorphous metal, and a method of manufacturing thereof. Also, provided are a flexible display device including an electrode or wiring including an amorphous metal layer and a crystalline metal layer, and a method of manufacturing thereof.

6 Claims, 12 Drawing Sheets

(51) Int. Cl.
  *H01L 27/32* (2006.01)
  *H01L 27/12* (2006.01)
  *G09G 3/3233* (2016.01)
  *H01L 51/00* (2006.01)
  *G09G 3/3208* (2016.01)

(52) U.S. Cl.
  CPC ...... *G09G 2380/02* (2013.01); *H01L 51/0097* (2013.01); *H01L 51/5203* (2013.01)

(56) References Cited

U.S. PATENT DOCUMENTS

2016/0349134 A1* 12/2016 Jeon .......................... G01L 1/14
2019/0027622 A1*  1/2019 Shida ................. H01L 51/5056

FOREIGN PATENT DOCUMENTS

| KR | 1020110128153 A | 11/2011 |
| KR | 1020160140431 A | 12/2016 |
| KR | 1020170018718 A | 2/2017 |

* cited by examiner

ELECTRODE OR WIRING COMPRISING AMORPHOUS METAL LAYER, FLEXIBLE DISPLAY DEVICE COMPRISING THE SAME AND MANUFACTURING METHOD THEREOF

CROSS-REFERENCE TO RELATED APPLICATIONS

This application claims priority under 35 U.S.C. § 119 to Korean Patent Application No. 10-2017-0121747, filed on Sep. 21, 2017, in the Korean Intellectual Property Office, the disclosure of which is incorporated herein by reference in its entirety.

TECHNICAL FIELD

The following disclosure relates to a flexible display device including an electrode or wiring including an amorphous metal layer and a method of manufacturing the flexible display device.

BACKGROUND

Recently, the display market has rapidly changed in terms of a flat display that is easily large-sized and lightweight. Examples of such a flat display include a liquid crystal display (LCD), a plasma display panel (PDP), an organic electro luminescence display (OLED), and so on. The flat display uses a glass substrate as a support for supporting a plurality of thin films. The glass substrate has a limitation in being thinned and has a problem in that, even if the glass substrate is thinned, the glass substrate easily breaks due to no durability and flexibility.

Accordingly, recently, to embody a flexible display, flexible displays using a substrate formed of a material with high durability while having a small thickness, such as plastic or metal foil, instead of a glass substrate without durability and flexibility have been introduced.

Accordingly, a flexible display formed by covering a circuit and a light emitting material on a flexible polymer substrate or a thinned metal substrate instead of a conventional glass substrate of the flat display has been introduced.

However, in this case, when a device is bent by a predetermined degree or more, limited flexibility is provided due to a mechanical limitation of a thin film and there is a limit in embodying a highly flexible image interface. In addition, such limited flexibility of a display degrades portability and wearability of an electronic device including the display and, thus, there is a limit in receiving information anytime and anywhere As well as the aforementioned polymer substrate, a flexible display is embodied using an organic light emitting layer, an organic inactive layer, and so on, which are formed of an organic material. However, the electrical conductivity of an organic material is not as high as a metal wiring and, thus, it is not easy to replace a metal wiring of a display with an organic material.

A breaking strain limitation of a metal wiring is about 1% and, thus, when a display panel is bent, the possibility that the metal wiring breaks or is cut is high. Accordingly, there are still other components that use silicon nitrides, but there is the possibility that the components become cracked.

Accordingly, there has been a need for flexible display devices that are capable of being bent, in which a wiring is prevented from breaking or being cut due to warping or bending while maintaining excellent electrical conductivity as much as the metal wiring.

CITED REFERENCE

Patent Document

Japanese Patent Laid-Open Publication No. 2010-152004

SUMMARY

An exemplary embodiment of the present invention is directed to providing a flexible display device including an electrode or wiring including an amorphous metal layer.

Another exemplary embodiment of the present invention is directed to providing a flexible display device including an electrode or wiring including an amorphous metal layer and a crystalline metal layer.

Another exemplary embodiment of the present invention is directed to providing a method of manufacturing a flexible display device using amorphous metal that is easily manufactured without a sudden change of temperature such as rapid cooling.

In one general aspect, a flexible display device includes an electrode or wiring including an amorphous metal layer.

According to an aspect of the present invention, the electrode or the wiring may further include a crystalline metal layer.

According to an aspect of the present invention, the amorphous metal layer may include amorphous metal that is an alloy of two or more types of metals.

According to an aspect of the present invention, the two or more types of metals may each have a difference in atomic numbers of three or more groups.

According to an aspect of the present invention, the amorphous metal may be any one selected from the group consisting of FeZr, CuZr, CoTi, NiTi, FeNbAl, LaAlCu, Al—Sc, ZrTiCuNiBe, AuSi, TiCoPdZr, and MgZnCa or a mixture thereof.

According to an aspect of the present invention, the electrode or the wiring may be formed by stacking an amorphous metal layer and a crystalline metal layer.

According to an aspect of the present invention, the electrode or the wiring may have a core-shell structure, and the core and the shell may each be selected from the amorphous metal layer and the crystalline metal layer.

According to an aspect of the present invention, the electrode or the wiring may be a multilayer structure, and the multilayer structure may be formed by stacking two or more layers of different amorphous metal layers and, then, stacking a crystalline metal layer as the uppermost layer.

The amorphous metal layer may have a thickness of 1 to 500 nm, and the crystalline metal layer may have a thickness of 1 to 300 nm.

According to an aspect of the present invention, the electrode may be any one or two or more selected from the group consisting of a gate, a source, and a drain of a transistor, and the wiring may be any one or two or more selected from the group consisting of a data line, a scan line, $V_{DD}$, a gate line, a source line, and a drain line.

In another general aspect, according to an aspect of the present invention, a method of manufacturing a flexible display device may include forming an electrode or a wiring by coating an amorphous metal layer on a substrate.

According to an aspect of the present invention, the amorphous metal layer may be coated while two or more types of metals are simultaneously deposited to form amorphous metal.

According to an aspect of the present invention, the amorphous metal layer may be formed by performing mixing melting on two or more types of metals to form amorphous metal and, then, coating the amorphous metal.

According to an aspect of the present invention, the two or more types of metals may each have a difference in atomic numbers of three or more groups.

According to an aspect of the present invention, the deposition may be performed at pressure of 0.001 to 700 Torr.

According to an aspect of the present invention, the flexible display device may include the electrode or the wiring formed by further coating a crystalline metal layer.

Other features and aspects will be apparent from the following detailed description, the drawings, and the claims.

DETAILED DESCRIPTION OF EMBODIMENTS

Hereinafter, a flexible display device including an electrode or wiring including an amorphous metal layer and a method of manufacturing the flexible display device will be described in detail according to embodiments of the present invention. However, the features of the present invention will be more clearly understood from the following embodiments and should not be limited by the accompanying drawings and the present invention may be embodied in various ways.

Unless mentioned otherwise, all terms including technical or scientific terms have the same meanings as generally understood by a person having ordinary skill in the art to which the present invention pertains. The terminology used herein is for the purpose of describing particular embodiments only and is not intended to be limiting of exemplary embodiments.

The present invention relates to a flexible display device including an electrode or wiring including an amorphous metal layer and a method of manufacturing the flexible display device.

Conventionally, a method using an organic material instead of flexible metal for devices is used to embody a flexible display, but there is a problem in that the method has difficulty in producing electrical conductivity as much as a metal material. Accordingly, a metal material is continuously used instead of an organic material or the metal material and the organic material are mixed and used, but the metal material has a high possibility that the metal material breaks or is cut by crack due to its low breaking strain limitation and, thus, there has been a need for a material replaceable with the metal material.

Accordingly, the present invention provides a flexible display device including an electrode or wiring including an amorphous metal layer that has flexibility and stretchable characteristics and prevents physical properties from being reduced over the long term even if an external force such as bending or lengthening is applied. In particular, differently from a conventional complicated process of applying a sudden change of temperature to melted metal to rapid cool the metal, an amorphous metal layer according to the present invention is easily manufactured to easily provide amorphous metal by alloying two or more types of metals, with atom sizes of which are different by atomic numbers of three or more groups, via simultaneous deposition or mixing melting.

The present invention is described below in detail.

A flexible display device according to the present invention may include an electrode or wiring including anamorphous metal layer.

The amorphous metal layer according to the present invention may include amorphous metal and, in this case, the amorphous metal may have scattered arrangement of atoms, like liquid. As such, the electrode or wiring including an amorphous metal layer including amorphous metal may be provided to a flexible display device and, thus, the flexible display device according to the present invention may achieve flexibility and stretchable characteristics. Accordingly, even if external force such as bending or lengthening is applied to the flexible display device, the flexible display device is barely degraded and is also prevented from being reduced in physical properties to maintain excellent physical properties over the long term.

The amorphous metal according to an exemplary embodiment of the present invention may be an alloy of two or more types of metals. The metal may be metal except for nonmetal in Group 1 to Group 17 on the periodic-table and, in detail, may be selected from the group consisting of alkali metal, alkali earth metal, transition metal, post-transition metal, metalloid, and so on.

The two or more types of metals according to an exemplary embodiment of the present invention may each have a difference in atomic numbers of three or more groups. In addition, in three or more types of metals, two or more types of metals may have a difference in atomic numbers of three or more groups. When there is the above atomic number difference, amorphous metal may be easily prepared during mixing melting or simultaneous deposition between two or more types of metals due to a difference in atom sizes and metals may be uniformly amorphized.

Conventional amorphous metal is rapid cooled and amorphized via a sudden change of temperature and, thus, is vulnerable to high temperature and, thus, there is a problem in that the possibility that the amorphous metal returns to crystalline metal is high. On the other hand, as described above, with regard to the amorphous metal according to the present invention, the amorphous metal may be easily prepared via mixing melting or simultaneous deposition of two or more types of metals having a difference by atomic numbers of three or more groups and may also be uniformly amorphized in a composition that is not crystallized even at high temperature. Accordingly, the amorphous metal may not be deformed by heat generated during driving of a flexible display and may achieve excellent physical properties over the long term.

The amorphous metal according to an exemplary embodiment of the present invention may be, for example, any one selected from the group consisting of FeZr, CuZr, CoTi, NiTi, FeNbAl, LaAlCu, Al—Sc, ZrTiCuNiBe, AuSi, TiCoPdZr, MgZnCa, and so on or a mixture thereof.

With regard to a flexible display device including the electrode or wiring including an amorphous metal layer including the aforementioned amorphous metal, when external force is applied to elongate the flexible display device, the flexible display device may be maintained in high electrical conductivity without a change in electrical conductivity due to excellent flexibility and stretchable characteristics and may not crack, e.g., may not break or may not be cut.

The flexible display device according to an exemplary embodiment of the present invention may include an electrode or wiring that further includes a crystalline metal layer. In detail, the flexible display device according to the present invention may include an electrode or wiring including an amorphous metal layer and a crystalline metal layer.

The amorphous metal layer and the crystalline metal layer may be configured in various forms.

For example, the electrode or wiring according to an exemplary embodiment of the present invention may be formed by stacking an amorphous metal layer and a crystalline metal layer. In more detail, the electrode or the wiring may be formed by disposing the amorphous metal layer on a substrate via deposition and, then, sequentially stacking the crystalline metal layer on the amorphous metal layer. On the other hand, the electrode or the wiring may be formed by disposing the crystalline metal layer on the substrate via deposition and, then, sequentially stacking the amorphous metal layer on the crystalline metal layer.

Figure 11:
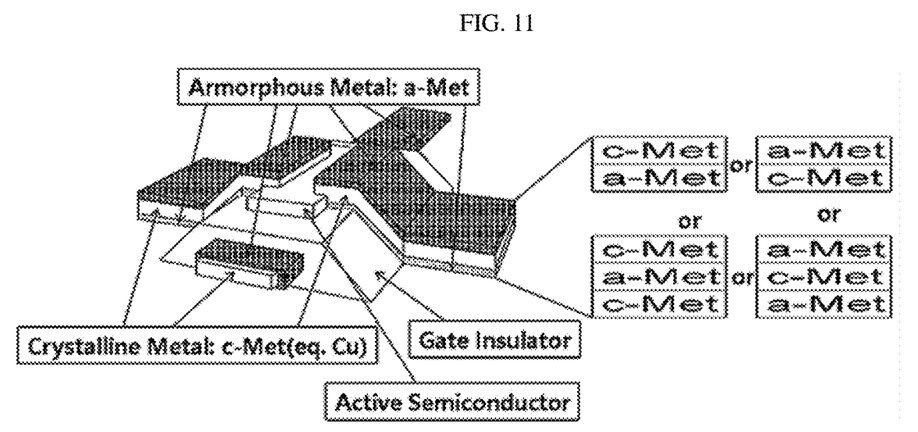
FIG. 11 is a schematic diagram of a flexible display device according to an exemplary embodiment of the present invention.

The electrode or wiring according to an exemplary embodiment of the present invention may be a multilayer structure. As described above, the electrode or the wiring may be formed by stacking three or more layers as well as by stacking two layers. For example, the electrode or the wiring may be a multilayer structure including two layers regardless of a stacking order of the amorphous metal layer and crystalline metal layer. In detail, the amorphous metal layer and the crystalline metal layer may be alternately stacked. In detail, the electrode or the wiring may be a multilayer structure shown in FIG. 11.

As another example, the multilayer structure may be a structure formed by stacking two or more of different amorphous metal layers and, then, stacking a crystalline metal layer as the uppermost layer. In this case, the uppermost layer may refer to the outermost layer based on a substrate. As another example, the multilayer structure may be a structure formed by stacking two or more types of amorphous metals A and B to configure ABAB, BABA, AB, BA, or the like and, then, stacking crystalline metal on the uppermost layer.

According to an exemplary embodiment of the present invention, to reduce initial resistance, the crystalline metal layer may include one or two or more crystalline metals selected from the group consisting of copper (Cu), titanium (Ti), molybdenum (Mo), aluminum (Al), platinum (Pt), gold (Au), and so on but is not limited thereto.

According to another exemplary embodiment of the present invention, the electrode or the wiring may have a core-shell structure and the core and the shell may each be selected from the amorphous metal layer and the crystalline metal layer. For example, when the core is configured with the amorphous metal layer, the shell surrounding the core may be configured with the crystalline metal layer in such a way that the amorphous metal layer is surrounded by the crystalline metal layer. On the other hand, positions of the amorphous metal layer and the crystalline metal layer may be changed.

As described above, when the electrode or the wiring includes both the amorphous metal layer and the crystalline metal layer, initial resistance may be remarkably reduced and highly enhanced mechanical strength and flexibility may be ensured compared with the case in which the electrode or the wiring includes an amorphous metal layer as a single layer. Even if physical external force is applied, excellent mechanical strength, flexibility, and stretchable characteristics may be maintained without reduction therein over the long term.

According to an exemplary embodiment of the present invention, the amorphous metal layer may have a thickness in the range of 1 to 500 nm, in detail, in the range of 10 to 300 nm, but is not limited thereto. The crystalline metal layer may have a thickness in the range of 1 to 300 nm, in detail, in the range of 10 to 300 nm, but is not limited thereto. In the case of a thickness in the above range, binding strength with a substrate and between layers may be increased and excellent flexibility and stretchable characteristics may be maintained due to low degradation despite repeated physical external force.

According to an exemplary embodiment of the present invention, when elongation is applied to a flexible display device, a sheet resistance change value $\Delta R_s$ may be represented according to Expression 1 below.

$$\frac{R_{s0}}{R_{s40}} \leq 300 \qquad \text{[Expression 1]}$$

In Expression 1 above, $R_{s0}$ is a sheet resistance value when elongation is not applied to a flexible display device and $R_{s40}$ is a sheet resistance value when the flexible display device is elongated by elongation of 40%.

The sheet resistance change value $\Delta R_s$ may be equal to or less than 250. In the case of the aforementioned sheet resistance change value, the flexible display device may be less degraded despite physical external force and may be maintained with excellent flexibility and stretchable characteristics over the long term.

In detail, even if the flexible display device according to the present invention is elongated by elongation of 40%, the flexible display device may have a low sheet resistance change value and excellent stretchable characteristics. In more detail, when the flexible display device is elongated up to elongation of 40%, a sheet resistance value may be equal to or less than 1,500Ω/□. In detail, the sheet resistance value may be in the range of 100 to 1,500Ω/□, in detail, in the range of 100 to 1,100Ω/□.

According to an exemplary embodiment of the present invention, the flexible display device may include the aforementioned electrode or wiring. The electrode may be any one or two or more selected from the group consisting of a gate, a source, and a drain of a transistor and the wiring may be any one or two or more selected from the group consisting of a data line, a scan line, $V_{DD}$, a gate line, a source line, a drain line, and so on. The flexible display device including the electrode or the wiring may ensure excellent flexibility and stretchable characteristics and, thus, even if physical external force such as lengthening or bending is applied to the flexible display device, low resistance and excellent electrical conductivity may be maintained.

Figure 1:
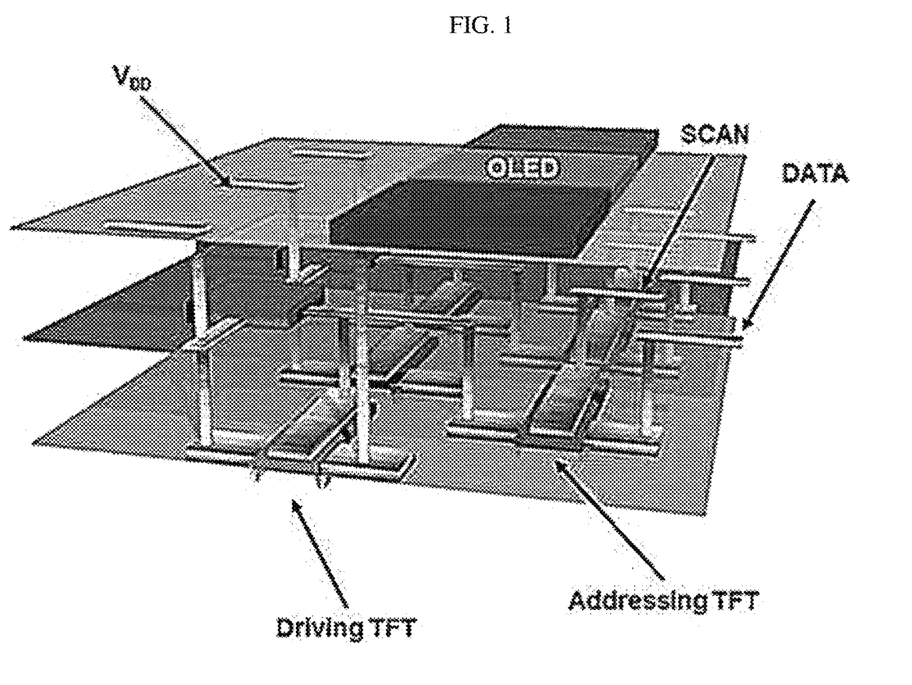
FIG. 1 is a cross-sectional view of a display according to an exemplary embodiment of the present invention.
Figure 2:
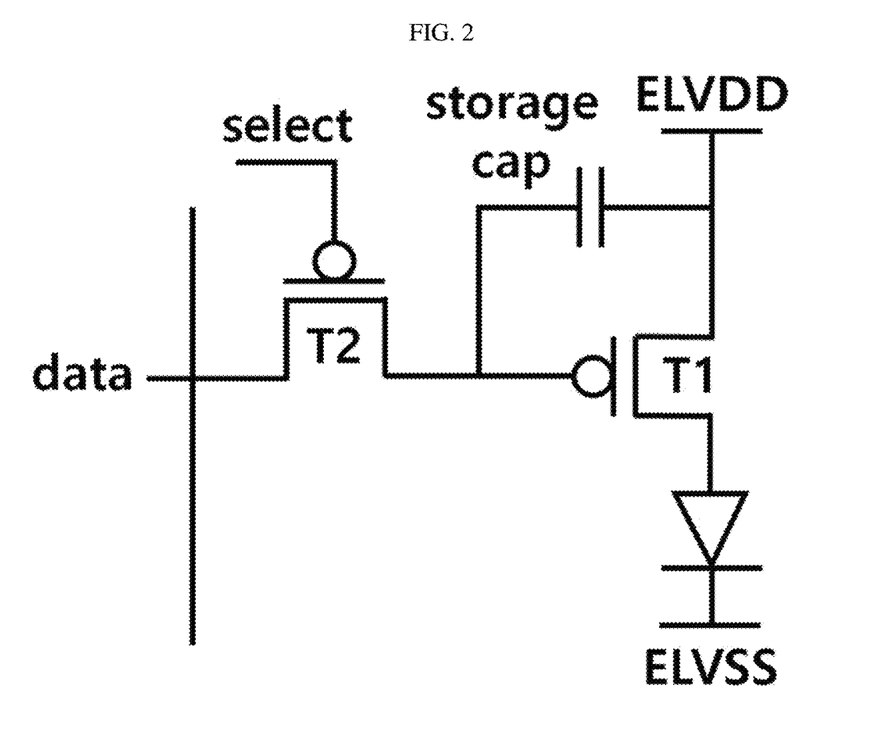
FIG. 2 is a diagram of an equivalent circuit of a display according to an exemplary embodiment of the present invention.
Figure 3:
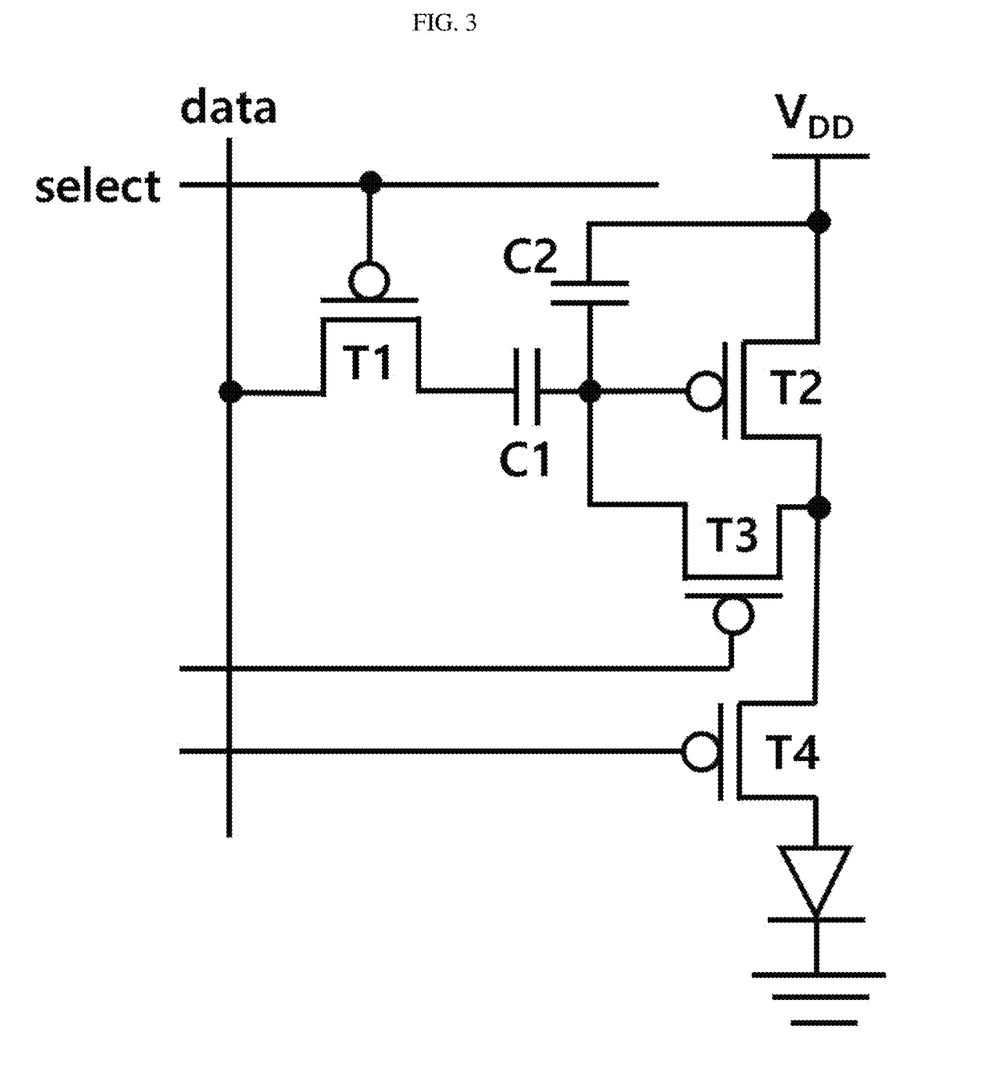
FIG. 3 is a diagram of an equivalent circuit of a display according to another exemplary embodiment of the present invention.
Figure 4:
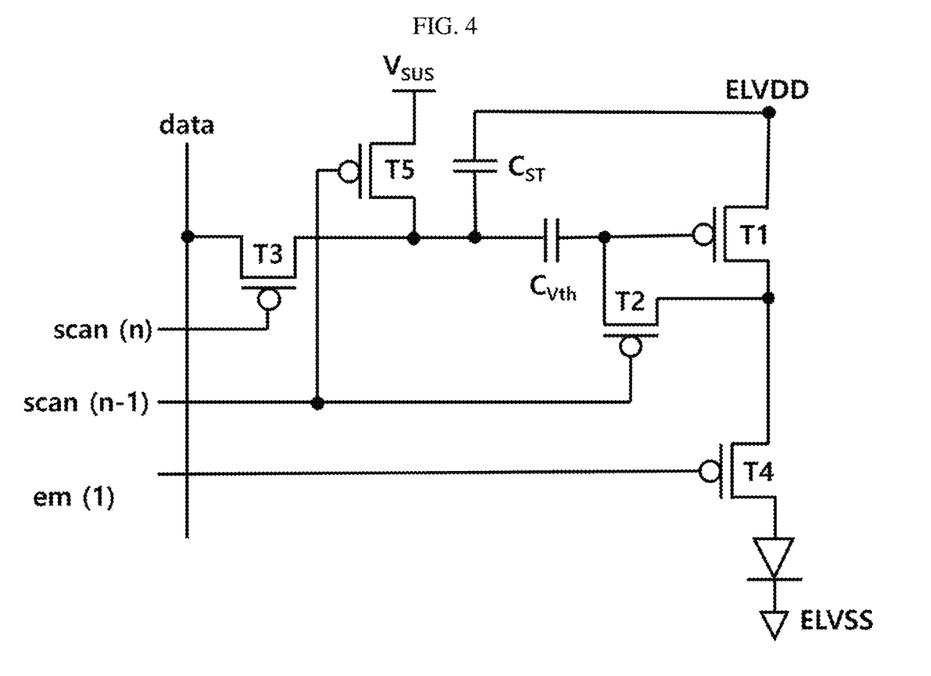
FIG. 4 is a diagram of an equivalent circuit of a display according to another exemplary embodiment of the present invention.
Figure 5:
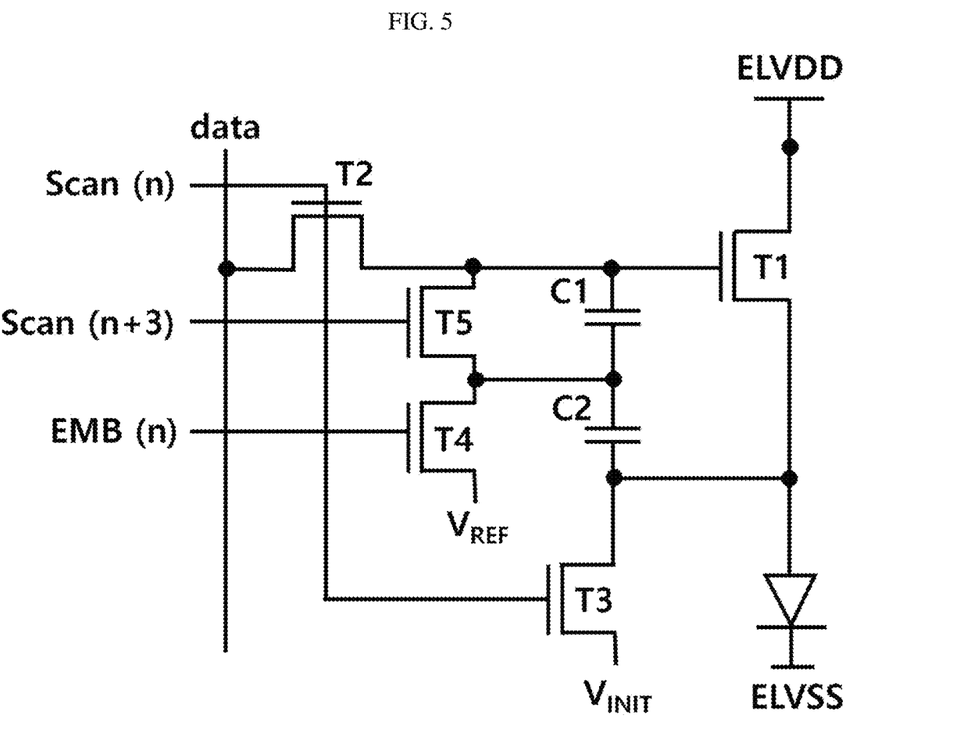
FIG. 5 is a diagram of an equivalent circuit of a display according to another exemplary embodiment of the present invention.
Figure 6:
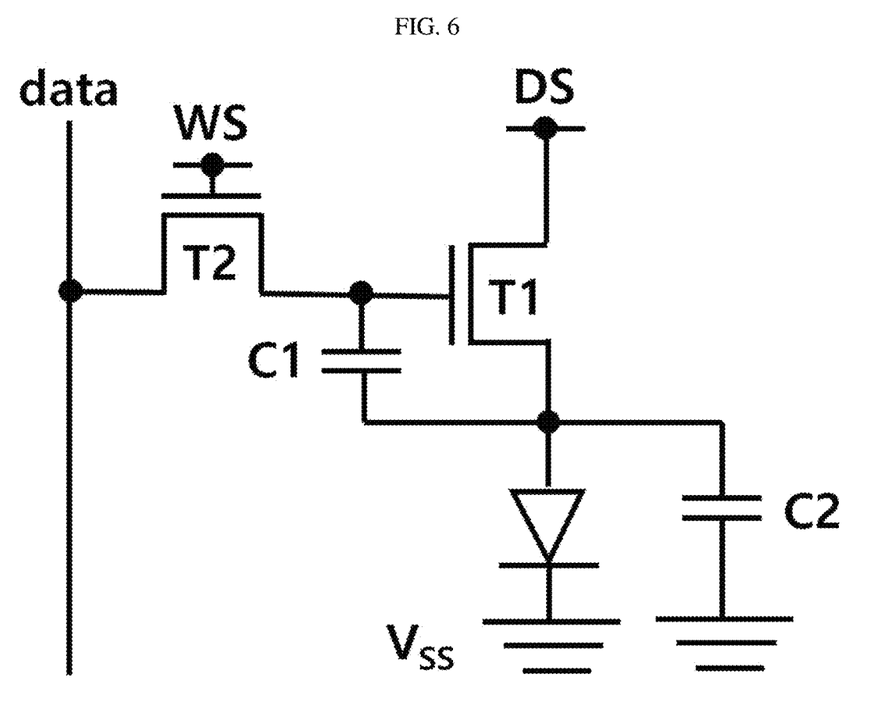
FIG. 6 is a diagram of an equivalent circuit of a display according to another exemplary embodiment of the present invention.
Figure 7:
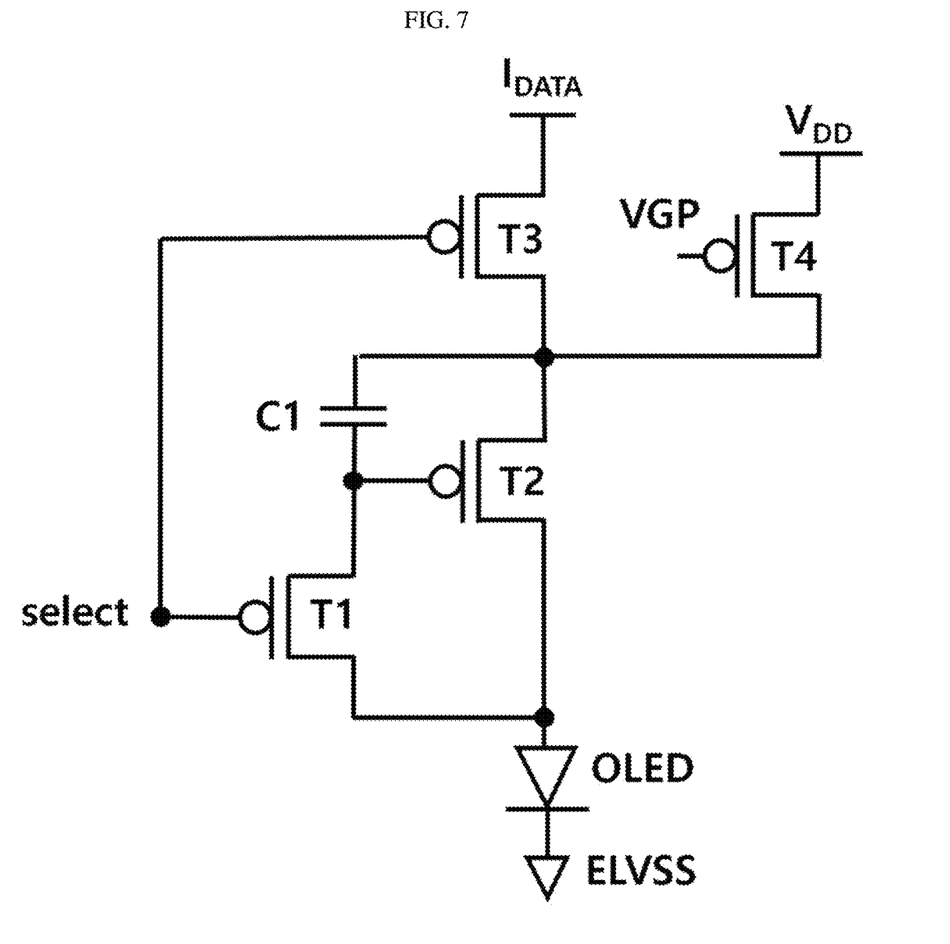
FIG. 7 is a diagram of an equivalent circuit of a display according to another exemplary embodiment of the present invention.
Figure 8:
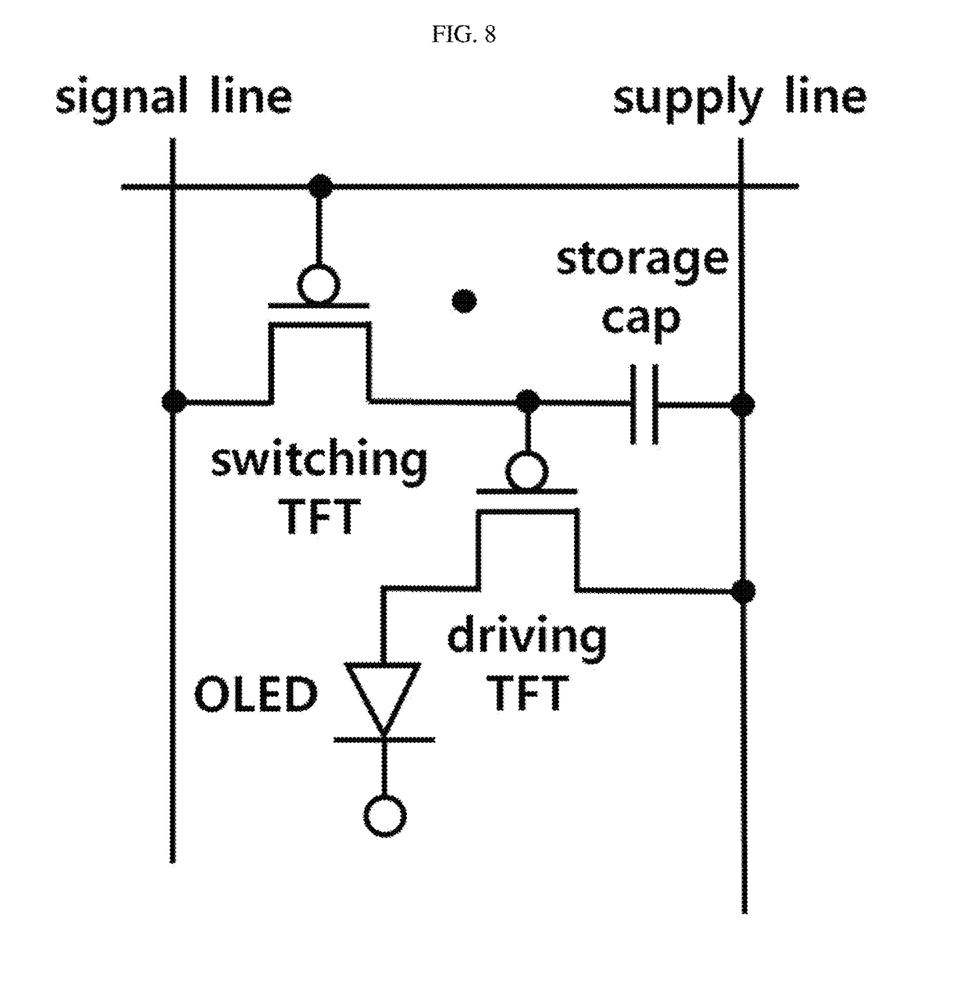
FIG. 8 is a diagram of an equivalent circuit of a display according to another exemplary embodiment of the present invention.
Figure 9:
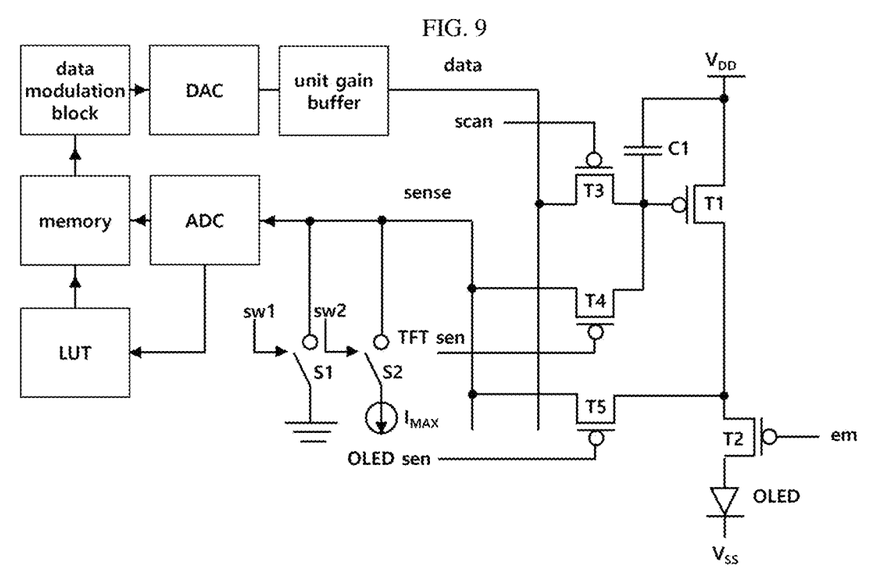
FIG. 9 is a diagram of an equivalent circuit of a display according to another exemplary embodiment of the present invention.

In detail, as shown in FIGS. 2 to 9, the flexible display device may include an amorphous metal layer in an electrode or wiring used in various compensation circuits for compensating for a change in threshold voltage Vth of a switching device. In addition, as shown in FIG. 1, the flexible display device may include an electrode or wiring used in an equivalent circuit of an OLED display including an addressing thin film transistor (addressing TFT), a driving thin film transistor (driving TFT), and an organic light-emitting diode (OLED) or an equivalent circuit of a display in which an OLED and four TFTs including a threshold voltage compensating electrical circuit network of a TFT are present.

Such a flexible display device may be manufactured using the following method, but this is merely an example and, thus, any well-known technology may be used rather than being particularly limited.

The present invention is described below in detail.

According to an exemplary embodiment of the present invention, a method of manufacturing a flexible display device may include coating an amorphous metal layer on a substrate to form an electrode or a wiring.

The amorphous metal layer according to the present invention may include amorphous metal and, in this case, the amorphous metal may have scattered arrangement of atoms, like liquid. As such, the electrode or wiring including an amorphous metal layer including amorphous metal may be provided to a flexible display device and, thus, the flexible display device according to the present invention may achieve flexibility and stretchable characteristics. Accordingly, even if external force such as bending or lengthening is applied to the flexible display device, the physical properties of the flexible display device may be prevented from being reduced and excellent physical properties may be maintained.

The substrate according to an exemplary embodiment of the present invention may be a substrate for forming an amorphous metal layer and may have flexibility for the flexibility of a flexible display device. For example, the substrate may be formed of any one or two or more selected from the group consisting of polyimide, polyetherimides, polyethersulfone, polyethylene terephthalate, polybutylene terephtalate, polyethylene naphthalate, polycarbonate, polyurethane, polydimethylsiloxane, nano cellulose, and so on. The thickness of the substrate may not be particularly limited as long as the substrate has flexibility and maintains mechanical stability but, for example, the thickness of the substrate may be in the range of 1 to 500 μm, in detail, in the range of 1 to 300 μm, in more detail, in the range of 50 to 300 μm but is not limited thereto.

Conventionally, a method using a flexible polymer substrate of devices or an organic material instead of metal is used to embody a flexible display. In the former case, there is a limitation in flexibility and, in particular, the latter case has a problem in that electrical conductivity as much as a metal material is not achieved. Accordingly, a metal material is continuously used or mixed and used instead of use of an organic material, but the metal material has a high possibility that the metal material breaks or is cut by crack due to its low breaking strain limitation and, thus, there has been a need for a material replaceable with the metal material.

Accordingly, the present invention provides a flexible display device including an electrode or wiring including an amorphous metal layer, which has flexibility and stretchable characteristics and prevents from being reduced in physical properties even if an external force such as bending or lengthening is applied. In particular, differently from a conventional complicated process of applying a sudden change of temperature to melted metal to rapid cool the metal, an amorphous metal layer according to the present invention is easily manufactured to easily provide amorphous metal by alloying two or more types of metals, with atom sizes of which are different by atomic numbers of three or more groups.

The amorphous metal according to an exemplary embodiment of the present invention may be prepared with an alloy of two or more metals. The metal may be metal except for nonmetal in Group 1 to Group 17 on the periodic-table and, in detail, may be selected from the group consisting of alkali metal, alkali earth metal, transition metal, post-transition metal, metalloid, and so on.

The two or more types of metals according to an exemplary embodiment of the present invention may each have a difference in atomic numbers of three or more groups. In addition, in three or more types of metals, two or more types of metals may have a difference in atomic numbers of three or more groups. When there is the above atomic number difference, amorphous metal may be easily prepared during mixing melting or simultaneous deposition between two or more types of metals due to a difference in atom sizes and metals may be uniformly amorphized.

The coating method according to an exemplary embodiment of the present invention is not particularly limited but coating may be performed using any one or two or more selected from the group consisting of inkjet printing, screen printing, gravure printing, offset printing, spin coating, screen printing technique, sputtering, thermal evaporation, chemical vapor deposition, electro deposition, spray coating, and so on. In detail, the amorphous metal layer may be uniformly coated and may be coated using a sputtering method to enhance adhesive force on a substrate but the present invention is not limited thereto.

As an example of the method of forming the amorphous metal layer, the amorphous metal layer according to an exemplary embodiment of the present invention may be coated while two or more types of metals are simultaneously deposited to form amorphous metal.

The amorphous metal layer according to another exemplary embodiment of the present invention may be prepared by coating amorphous metal formed via mixing melting of two or more types of metals.

As described above, differently from a conventional complicated process of applying a sudden change of temperature to melted metal to rapid cool the metal, an amorphous metal layeris easily manufactured to easily provide amorphous metal by alloying two or more types of metals, with atom sizes of which are different by atomic numbers of three or more groups. Accordingly, uniformly amorphized amorphous metal may be provided to form an amorphous metal layer having flexibility and stretchable characteristics while having excellent mechanical strength.

According to an exemplary embodiment of the present invention, the deposition may be performed under pressure of 0.001 to 700 Torr or 0.001 to 100 Torr and, in detail, the deposition may be performed under pressure of 3 mTorr to 7 mTorr, in detail, 3 mTorr, 5 mTor, or 7 mTorr. In addition, the deposition may be performed at temperature of 20 to 300° C., in detail, 20 to 100° C., in more detail, 20 to 30° C.

According to an exemplary embodiment of the present invention, the method of manufacturing the flexible display device may include further coating the crystalline metal layer. In detail, the flexible display device according to the present invention may include the electrode or wiring including the amorphous metal layer and the crystalline metal layer.

The amorphous metal layer and the crystalline metal layer may be configured in various forms.

For example, the electrode or wiring according to an exemplary embodiment of the present invention may be formed by stacking the amorphous metal layer and the crystalline metal layer. In more detail, the amorphous metal layer may be coated on a substrate and, then, the crystalline metal layer may be sequentially stacked on the amorphous metal layer. On the other hand, the crystalline metal layer may be coated on the substrate and, then, the amorphous metal layer may be sequentially stacked on the crystalline metal layer.

As described above, three or more layers as well as two layers may be stacked. For example, the electrode or the wiring may be a multilayer structure including two layers regardless of a stacking order of the amorphous metal layer and crystalline metal layer. In detail, the amorphous metal layer and the crystalline metal layer may be alternately stacked.

As another example, the multilayer structure may be a structure formed by stacking two or more of different amorphous metal layers and, then, stacking a crystalline metal layer as the uppermost layer. In this case, the uppermost layer may refer to the outermost layer based on a substrate. For example, the multilayer structure may be a structure formed by stacking two or more types of amorphous metals A and B to configure ABAB, BABA, AB, BA, or the like and, then, stacking crystalline metal on the uppermost layer.

According to another exemplary embodiment of the present invention, an electrode or a wiring may have a core-shell structure and the core and the shell may each be selected from the amorphous metal layer and the crystalline metal layer. For example, when the core is configured with the amorphous metal layer, the shell surrounding the core may be configured with the crystalline metal layer in such a way that the amorphous metal layer is surrounded by the crystalline metal layer. On the other hand, positions of the amorphous metal layer and the crystalline metal layer may be changed.

As described above, when the electrode or the wiring includes both the amorphous metal layer and the crystalline metal layer, initial resistance may be remarkably reduced and highly enhanced mechanical strength and flexibility may be ensured compared with the case in which the electrode or the wiring includes an amorphous metal layer as a single layer. Even if physical external force is applied, excellent mechanical strength, flexibility, and stretchable characteristics may be maintained without reduction therein over the long term.

Accordingly, according to an exemplary embodiment of the present invention, the flexible display device manufactured as described above may include an electrode or wiring including an amorphous metal layer to achieve excellent flexibility and stretchable characteristics and, even if external force is applied to the flexible display device, thermal conductivity or electrical conductivity may be maintained while a low resistance value is maintained over the long term.

Figure 12:
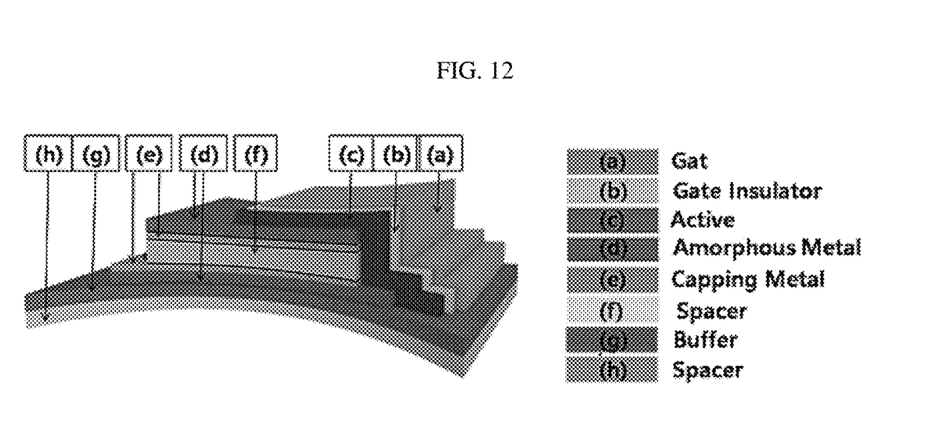
FIG. 12 is a schematic cross-sectional view showing the case in which a flexible display device according to an exemplary embodiment of the present invention is applied to a vertical-type thin film transistor.

According to an exemplary embodiment of the present invention, the flexible display device may be manufactured by including amorphous metal in an electrode or a wiring in a stacked vertical-type TFTs, as shown in FIG. 12. For example, the vertical-type TFT may be formed by stacking any one or two or more selected from the group consisting of a spacer, a buffer, an amorphous metal layer, a crystalline metal layer, an active layer, a gate insulating layer, a gate, and so on but is not limited thereto.

Accordingly, even if the flexible display device according to the present invention is applied to a technological field such as wearable device or a flexible display, excellent characteristics may be maintained over the long term.

Hereinafter, a flexible display device including an electrode or wiring including an amorphous metal layer and a method of manufacturing the flexible display device will be described in more detail according to embodiments of the present invention. However, the features of the present invention will be more clearly understood from the following embodiments and should not be limited by the accompanying drawings and the present invention may be embodied in various forms.

Unless mentioned otherwise, all terms including technical or scientific terms have the same meanings as generally understood by a person having ordinary skill in the art to which the present invention pertains. The terminology used herein is for the purpose of describing particular embodiments only and is not intended to be limiting of exemplary embodiments.

Unless mentioned otherwise, a unit of additives may be wt %.

EXAMPLE 1

Platinum (Pt) (2-inch sputter target, iTASCO) was deposited on a polydimethylsiloxane (Sylgard 184, Dow Corning Co.) substrate with a thickness of 300 μm to form a crystalline metal layer of 50 nm. FeZr(66:33 wt %) target (iTASCO) amorphous metal was deposited on the first crystalline metal layer to form an amorphous metal layer of 100 nm to function as both a gate and a wiring. Then, $SiO_2$ was sputtered with 300 nm using a gate insulator, an indium zinc oxide (IZO) channel layer was sputtered, and source/drain and a wiring were formed using the same method as that of the gate. The deposition was performed under a deposition condition including a basic vacuum degree: $3\times10^{-9}$ and an operation vacuum degree: $3\times10^{-3}$ Torr and, in this regard, amorphous metal was deposited at power of 40W and crystalline metal was deposited at power of 10W and at a room temperature/argon (Ar) atmosphere.

EXAMPLE 2

A flexible display device was manufactured in the same manner as in Example 1 except that a crystalline metal layer was not formed.

COMPARATIVE EXAMPLE 1

A flexible display device was manufactured in the same manner as in Example 1 except that a tantalum (Ta) layer (99.9%, iTASCO) was formed instead of an amorphous metal layer.

COMPARATIVE EXAMPLE 2

A flexible display device was manufactured in the same manner as in Example 1 except that a crystalline metal layer was formed using gold (Au) instead of platinum (Pt) and a titanium (Ti) layer (99.9%, iTASCO) was formed instead of an amorphous metal layer.

EXPERIMENTAL EXAMPLE 1

Sheet Resistance Comparison Depending on Elongation

Figure 10:
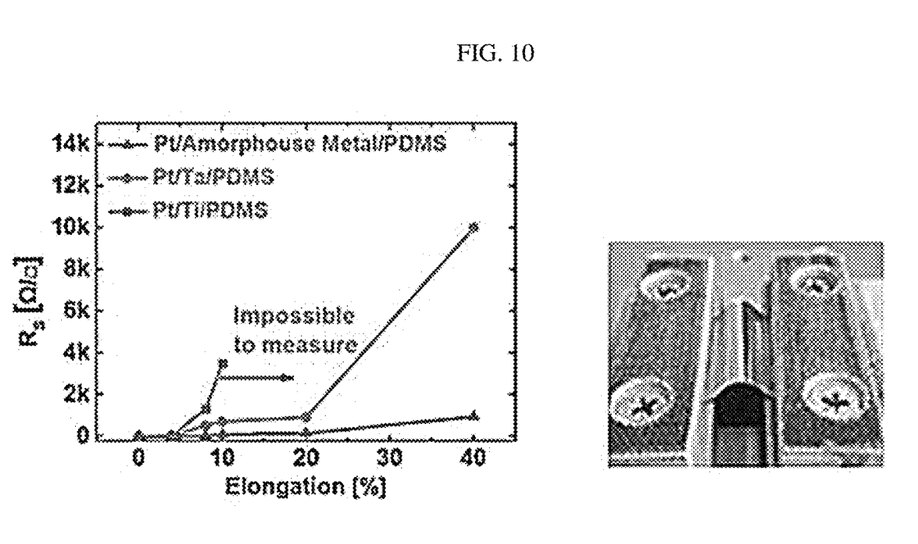
FIG. 10 shows a resistance change value and an experimental image of a flexible display device according to an exemplary embodiment of the present invention.

As shown in FIG. 10, a sheet resistance was measured depending on elongation of an electrode manufactured like in Examples 1 and 2, Comparative Example 1, and Comparative Example 2 according to the present invention. As seen from FIG. 10, in the case of Example 1, even if a length of the electrode is elongated up to 40% thereof, a change in sheet resistance is low and, thus, excellent electrical conductivity is maintained despite physical external force. Example 2 has a high initial resistance value compared with Example 1 but, even if physical external force is applied, excellent electrical conductivity may be maintained over the long term.

On the other hand, in the case of Comparative Example 1, when a length of the electrode is elongated up to 20% thereof, the electrode cracks which causes increased sheet resistance and, simultaneously, does not maintain electrical conductivity. In addition, in the case of Comparative Example 2, when a length of the electrode is elongated up to 10% thereof, the electrode cracks and, then, when a length of the electrode is elongated up to 20% or greater, the electrode is torn and sheet resistance is not capable of being measured. As such, it may be seen that, in the case of Comparative Example 1 and Comparative Example 2, as only crystalline metal layers are stacked, flexibility and stretchable characteristics are not achieved and, thus, the electrode cracks and is torn due to external force such as lengthening.

Accordingly, the flexible display device according to the present invention may include an electrode or wiring including an amorphous metal layer to achieve excellent flexibility and stretchable characteristics and, even if external force is applied to the flexible display, excellent thermal conductivity or electrical conductivity may be maintained while a low resistance value is maintained over the long term.

The flexible display device according to the present invention may advantageously have flexibility and stretchable characteristics.

The flexible display device according to the present invention may advantageously have low initial resistance and may be advantageously prevented from being reduced in physical properties over the long term by external force such as bending or lengthening.

The method of manufacturing a flexible display device according to the present invention may manufacture amorphous metal that does not require a complicated process to easily form an amorphous metal layer.

While the flexible display device including the electrode or wiring including the amorphous metal layer and the method of manufacturing the flexible display device have been particularly shown and described with reference to exemplary embodiments thereof, it will be understood by those of ordinary skill in the art that various changes in form and details may be made therein without departing from the spirit and scope of the present invention as defined by the following claims.

Accordingly, it will be obvious to those skilled in the art to which the present invention pertains that the present invention described above is not limited to the above-mentioned exemplary embodiments and the accompanying drawings, but may be variously substituted, modified, and altered without departing from the scope and spirit of the present invention.

What is claimed is:

1. A method of manufacturing a flexible display device, the method comprising forming an electrode or a wiring on a substrate having a thickness of 1 to 500 µm,
   wherein the electrode or the wiring is a multilayer structure,
   wherein the multilayer structure is such that an amorphous metal layer and a crystalline metal layer are alternately stacked in a total of three or more layers, and the amorphous metal layer and the crystalline metal layer directly contact each other,
   wherein the amorphous metal layer is formed by depositing two or more types of metals simultaneously on the substrate or the crystalline metal layer, or by coating a melted mixture of two or more types of metals on the substrate or the crystalline metal layer, and
   wherein the two or more types of metals each have a difference in atomic numbers of three or more groups.

2. The method of claim 1, wherein the depositing is performed under pressure of 0.001 to 700 Torr.

3. The method of claim 1, wherein the substrate is formed of any one or two or more selected from the group consisting of polyimide, polyetherimides, polyethersulfone, polyethylene terephthalate, polybutylene terephtalate, polyethylene naphthalate, polycarbonate, polyurethane, polydimethylsiloxane, and nano cellulose.

4. The method of claim 1, wherein the amorphous metal may be any one selected from the group consisting of FeZr, CuZr, CoTi, NiTi, FeNbAl, LaAlCu, Al—Sc, AuSi, TiCoPdZr, and MgZnCa or a mixture thereof.

5. The method of claim 1, wherein the crystalline metal layer includes one or two or more crystalline metals selected from the group consisting of copper (Cu), molybdenum (Mo), platinum (Pt), and gold (Au).

6. The method of claim 1, wherein the amorphous metal layer is formed by depositing two or more types of metals simultaneously on the substrate or the crystalline metal layer.

* * * * *